US008512527B2

(12) United States Patent (10) Patent No.: US 8,512,527 B2
Lee (45) Date of Patent: Aug. 20, 2013

(54) MAGNET TRANSPORTATION SYSTEM, SPUTTERING APPARATUS INCLUDING THE SAME AND SPUTTERING METHOD

(75) Inventor: Youn-Goo Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 223 days.

(21) Appl. No.: 13/177,852

(22) Filed: Jul. 7, 2011

(65) Prior Publication Data

US 2012/0037492 A1 Feb. 16, 2012

(30) Foreign Application Priority Data

Aug. 11, 2010 (KR) .................. 10-2010-0077496

(51) Int. Cl.
*C23C 14/35* (2006.01)
(52) U.S. Cl.
USPC .................................. 204/192.12; 204/298.2
(58) Field of Classification Search
USPC .......................................... 204/192.12, 298.2
See application file for complete search history.

(56) References Cited

U.S. PATENT DOCUMENTS

| 5,855,744 A | 1/1999 | Halsey et al. |
| 2001/0009224 A1 | 7/2001 | Han et al. |

FOREIGN PATENT DOCUMENTS

| JP | 4054411 | 12/2007 |
| KR | 100345924 | 7/2002 |
| KR | 1020050046170 | 5/2005 |

*Primary Examiner* — Rodney McDonald
(74) *Attorney, Agent, or Firm* — Knobbe Martens Olson & Bear LLP

(57) ABSTRACT

A sputtering apparatus for uniformly eroding a sputtering target is disclosed. The sputtering apparatus includes a substrate, a sputtering target having a first surface facing the substrate, a magnet configured to apply a magnetic field to the sputtering target, and facing a second surface of the sputtering target, a guide rail connected to the magnet configured to support and guide the magnet member, wherein a first portion of the guide rail, corresponding to a central portion of the sputtering target, includes a linear portion in a first direction parallel to the second surface of the sputtering target, and wherein a second portion of the guide rail, corresponding to an edge portion of the sputtering target, includes an inclined portion away from the sputtering target in a second direction perpendicular to the first direction, a screw line formed in the first direction in parallel to the guide rail, and a connector connected to the magnet by an elastic, and configured to move the magnet in the first direction along the screw line.

17 Claims, 5 Drawing Sheets

MAGNET TRANSPORTATION SYSTEM, SPUTTERING APPARATUS INCLUDING THE SAME AND SPUTTERING METHOD

CROSS-REFERENCE TO RELATED APPLICATIONS

This application claims the benefit of Korean Patent Application No. 10-2010-0077496, filed on Aug. 11, 2010, in the Korean Intellectual Property Office, the disclosure of which is incorporated herein in its entirety by reference.

BACKGROUND

1. Field

One or more aspects of the present invention relate to magnet transportation systems for increasing usage efficiency of a sputtering target, a sputtering apparatus including the magnet transportation systems, and sputtering methods.

2. Description of the Related Technology

A sputtering system generally includes a loading/unloading chamber for forming an atmospheric pressure and a vacuum in order to buffer an atmospheric pressure. The system also includes a vacuum so that a substrate may be moved between a chamber at an atmospheric pressure and a chamber in a vacuum. A sputtering system also includes a sputtering chamber, a heating chamber and a transfer chamber. The sputtering chamber typically includes a sputtering substrate for forming a thin film such as a metal film on a substrate. The heating chamber is typically used for preliminarily heating the substrate in order to increase the characteristic of the thin film and the uniformity of the thin film prior to the forming of the thin film on the substrate. The transfer chamber is usually used for moving the substrate, by using a robot.

A sputtering process for forming the thin film on the substrate is performed in a sputtering apparatus included in the sputtering chamber. In the sputtering process, a target material is typically generated from a sputtering target by a magnetic field generated from a magnet member. During the sputtering process, when the sputtering target is eroded, an edge portion of the sputtering target is more eroded than a central portion of the sputtering target due to the reciprocating magnet member, and thus a usage efficiency of the sputtering target is remarkably reduced.

SUMMARY OF CERTAIN INVENTIVE ASPECTS

One or more aspects of the present invention provide sputtering apparatuses for uniformly eroding a sputtering target through a guide rail including an inclined portion, and an elastic member so as to increase usage efficiency of the sputtering target.

According to one aspect, a sputtering apparatus includes: a substrate, a sputtering target having a first surface facing the substrate, a magnet configured to apply a magnetic field to the sputtering target, and facing a second surface of the sputtering target, a guide rail connected to the magnet configured to support and guide the magnet member, where a first portion of the guide rail, corresponding to a central portion of the sputtering target, includes a linear portion in a first direction parallel to the second surface of the sputtering target, and where a second portion of the guide rail, corresponding to an edge portion of the sputtering target, includes an inclined portion away from the sputtering target in a second direction perpendicular to the first direction, a screw line formed in the first direction in parallel to the guide rail, and a connector connected to the magnet by an elastic, configured to move the magnet in the first direction along the screw line.

The sputtering apparatus may further include a plate configured to support the second surface of the sputtering target.

The magnet may be spaced apart from the sputtering target.

The sputtering apparatus may further include a motor configured to rotate the screw line, where the connector moves in the first direction while the screw line is rotated by the motor.

The elastic may includes a compression coil spring, and when the magnet is positioned in the linear portion, the compression coil spring may be relaxed, and when magnet is positioned in the inclined portion, the compression coil spring may be compressed.

The magnet may be connected to the guide rail through a bearing.

The portion of the guide rail along an edge portion of the sputtering target, may correspond to at least one of a starting portion, a turning portion and an ending portion of the magnet.

According to another aspect, a magnet transportation system includes: a magnet configured to apply a magnetic field to a sputtering target facing a surface of the sputtering target, a guide rail connected to the magnet configured to support and guide the magnet, where a portion of the guide rail along a central portion of the sputtering target includes a linear portion formed in a first direction parallel to the surface of the sputtering target, and where a portion of the guide rail, along an edge portion of the sputtering target, includes a portion inclined away from the sputtering target in a second direction perpendicular to the first direction, a screw line formed in the first direction parallel to the guide rail, and a connector connected to the magnet by an elastic configured to move the magnet member in the first direction along the screw line.

The magnet transportation system may further include a motor configured to rotate the screw line, where the connector may move in the first direction while the screw line is rotated by the motor.

The elastic may include a compression coil spring, and when the magnet is positioned in the linear portion, the compression coil spring may be relaxed, and when magnet is positioned in the inclined portion, the compression coil spring may be compressed.

The magnet may be connected to the guide rail through a bearing.

The portion of the guide rail along an edge portion of the sputtering target, may include at least one of a starting portion, a turning portion and an ending portion of the magnet.

According to another aspect, a sputtering method of a sputtering apparatus, where the sputtering apparatus includes: a sputtering target having a first surface facing a substrate, a magnet configured to apply a magnetic field to the sputtering target, and facing a second surface of the sputtering target, a guide rail connected to the magnet configured to support and guide the magnet, where a portion of the guide rail, along a central portion of the sputtering target, includes a linear portion formed in a first direction parallel to the second surface of the sputtering target, and where a portion of the guide rail, along an edge portion of the sputtering target, includes an portion inclined away from the sputtering target in a second direction perpendicular to the first direction, a screw line formed in the first direction so as to correspond to the guide rail, and a connector connected to the magnet by an elastic, configured to move the magnet in the first direction along the screw line, the method including: preparing the substrate, applying a magnetic field to the sputtering target while the magnet is moved in the first direction parallel to the second surface of the sputtering target, and generating a target material from the sputtering target corresponding to the magnet by the magnetic filed, and depositing the target material on the substrate, where, in the applying of the magnetic field, an intensity of the magnetic field is changed in the portion of the guide rail, corresponding to the edge portion of the sputtering target.

The intensity of the magnetic field may be changed by the inclined portion of the guide rail.

The method may further include moving the connector in the first direction while the screw line is rotated by a motor.

When the magnet is positioned in the linear portion, the elastic may be relaxed, and when the magnet is positioned in the inclined portion, the elastic may be compressed.

The elastic may include a compression coil spring.

BRIEF DESCRIPTION OF THE DRAWINGS

The above and other features and advantages of the present invention will become more apparent by describing in detail certain embodiments thereof with reference to the attached drawings in which.

DETAILED DESCRIPTION OF CERTAIN INVENTIVE EMBODIMENTS

Figure 1:
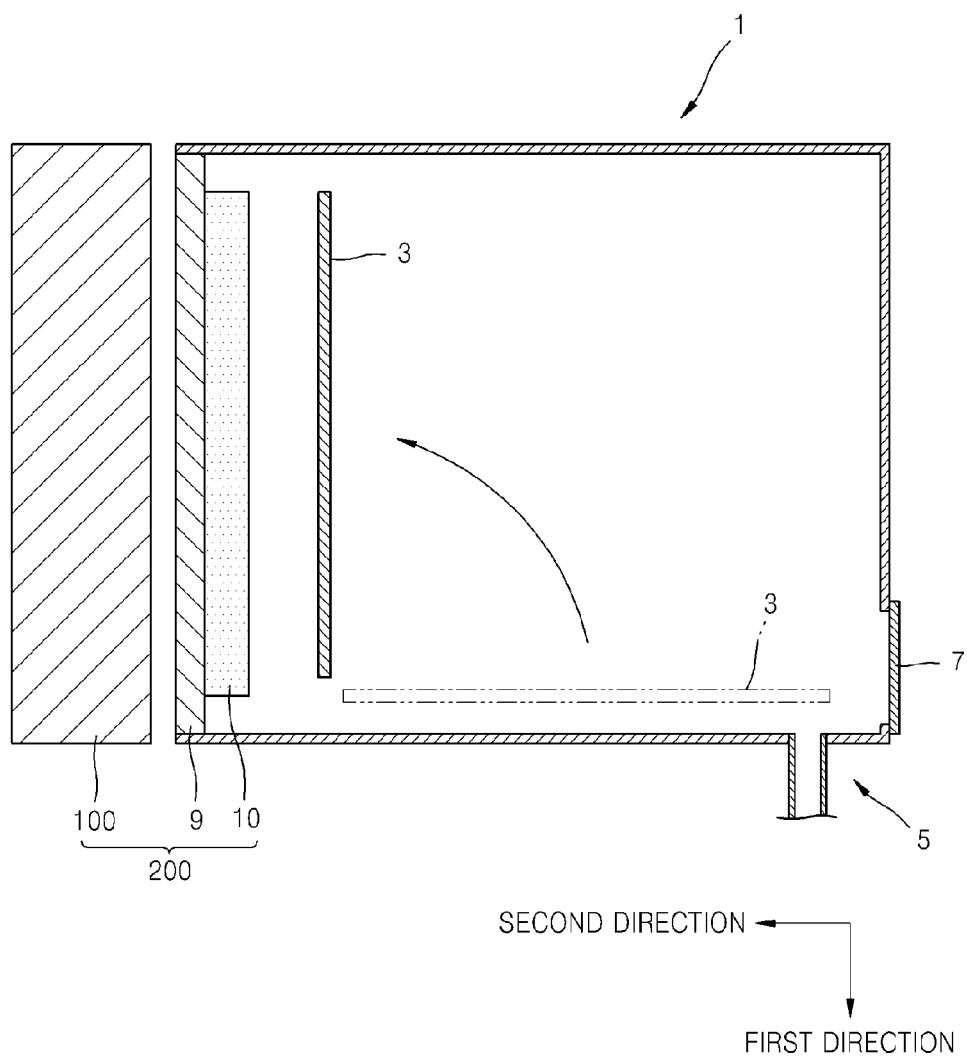
FIG. 1 shows an embodiment of a sputtering chamber including a sputtering apparatus.

Certain embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present disclosure.

Terms such as "first" and "second" are used herein merely to describe a variety of constituent elements, but the constituent elements are not limited by the terms. The terms are used only for the purpose of distinguishing one constituent element from another constituent element.

The terms used in the present disclosure are used for explaining a certain embodiment, not limiting the present inventive concept. Thus, the expression of singularity in the present disclosure includes the expression of plurality unless clearly specified otherwise in context. Also, the terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Hereinafter, the present invention will be described in detail by explaining certain embodiments with reference to the attached drawings.

FIG. 1 shows an embodiment of a sputtering chamber 1 including a sputtering apparatus 200.

Referring to FIG. 1, the sputtering chamber 1 includes the sputtering apparatus 200. A vacuum is formed in the sputtering chamber 1 so that target material particles may be sputtered on a surface of a substrate 3, such as a glass substrate or a plastic substrate, by using a plasma discharging method. The sputtering chamber 1 includes a gas line 5 disposed at one side thereof and for supplying an inactive gas such as argon (Ar). Although not illustrated in FIG. 1, the sputtering chamber 1 includes a support (not shown) for supporting the substrate 3 by using a plurality of pins. In some embodiments, the support includes a hinge axis or a robot arm. The support receives the substrate 3, puts it into a gate 7, disposed at one side of the sputtering chamber 1, in a horizontal state in which the substrate is positioned perpendicular to a sputtering target 10. The support also rotates the substrate 3 from the horizontal state to a vertical state in which the substrate 3 is positioned parallel to the sputtering target 10, and installed in the sputtering chamber 1.

The sputtering apparatus 200 may include the sputtering target 10, a plate 9 for supporting the sputtering target 10, and a magnet transportation system 100.

The plate 9 is fixed to one lateral surface of the sputtering chamber 1 so that a surface of the substrate 3 may be positioned parallel to the sputtering target 10 installed on the plate 9 when the support is rotated to the vertical state. Although not illustrated in FIG. 1, a power supply for supplying a direct current (DC) power may be connected to the plate 9. The DC power can be supplied to the plate 9 during a sputtering operation so as to operate the magnet transportation system 100.

The sputtering target 10 is disposed so that a first surface thereof may face the substrate 3. The sputtering target 10 can be a source for generating metal particles by a magnetic field so as to form a metal thin film on the substrate 3. The sputtering target 10 may be formed of a metal material such as aluminium (Al), an Al alloy, refractory metal silicide, gold (Au), copper (Cu), titanium (Ti), titanium (Ti)-tungsten (W), tungsten (W) or molybdenum (Mo), or of an inorganic material such as silicon dioxide, or the like. The sputtering target 10 generates the metal particles, and is simultaneously eroded. Thus, an erosion pattern on a surface of the sputtering target 10 may correspond to a deposition pattern on the substrate 3. An average thickness of the sputtering target 10 may be from about 5 mm to about 45 mm. The sputtering target 10 can have a uniform thickness. Thus, when a portion of the sputtering target 10 is eroded at a starting portion, a tuning portion, or an ending portion of a magnet member 110 (shown in FIG. 2), the sputtering target 10 does not continue to generate the metal particles at the eroded portion. If this happens, an entire portion of the sputtering target 10 needs to be replaced. This problem reduces the usage efficiency of the sputtering target 10.

Figure 2:
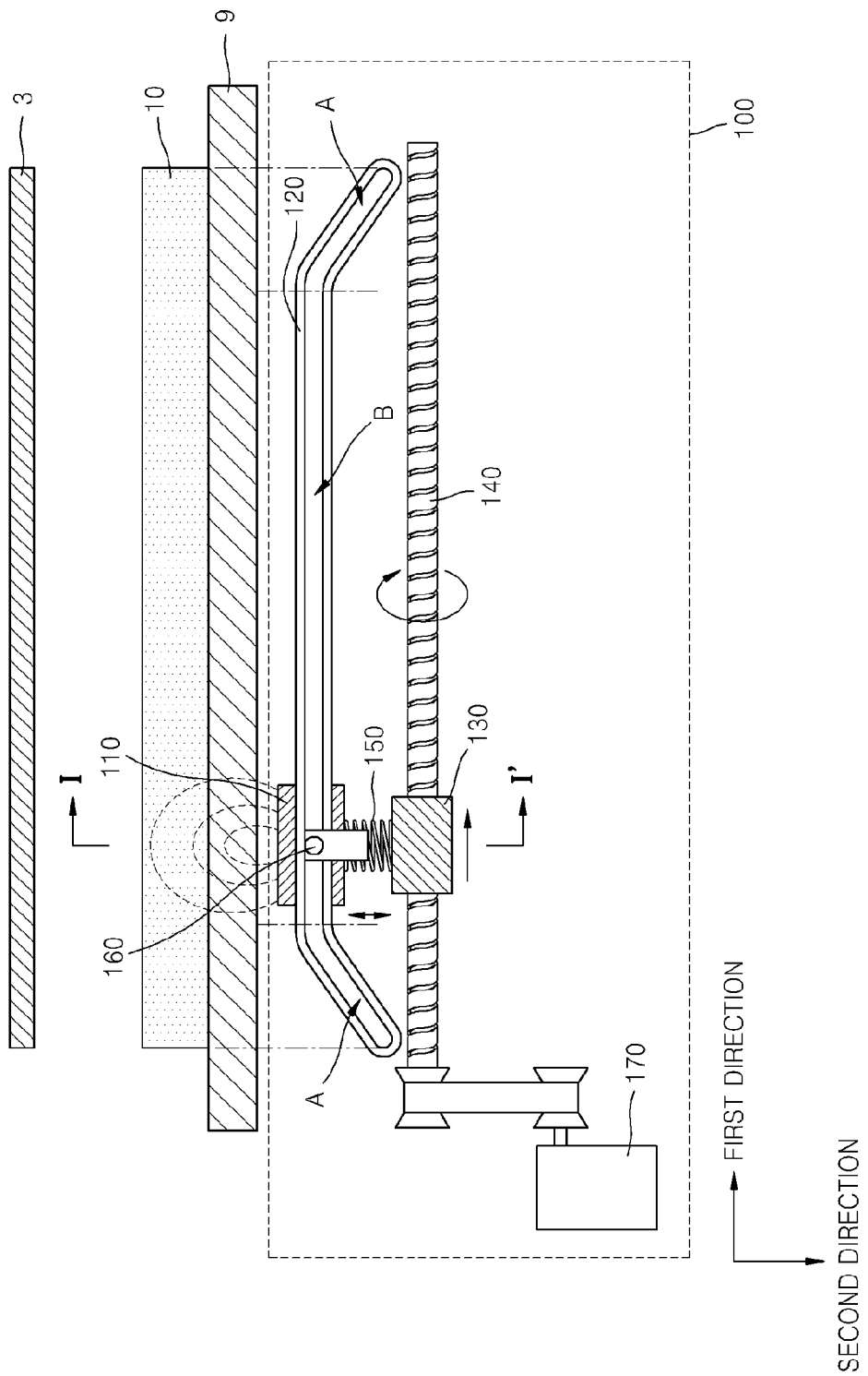
FIG. 2 shows an embodiment of a magnet transportation system included in the embodiment of the sputtering apparatus of FIG. 1.
Figure 3:
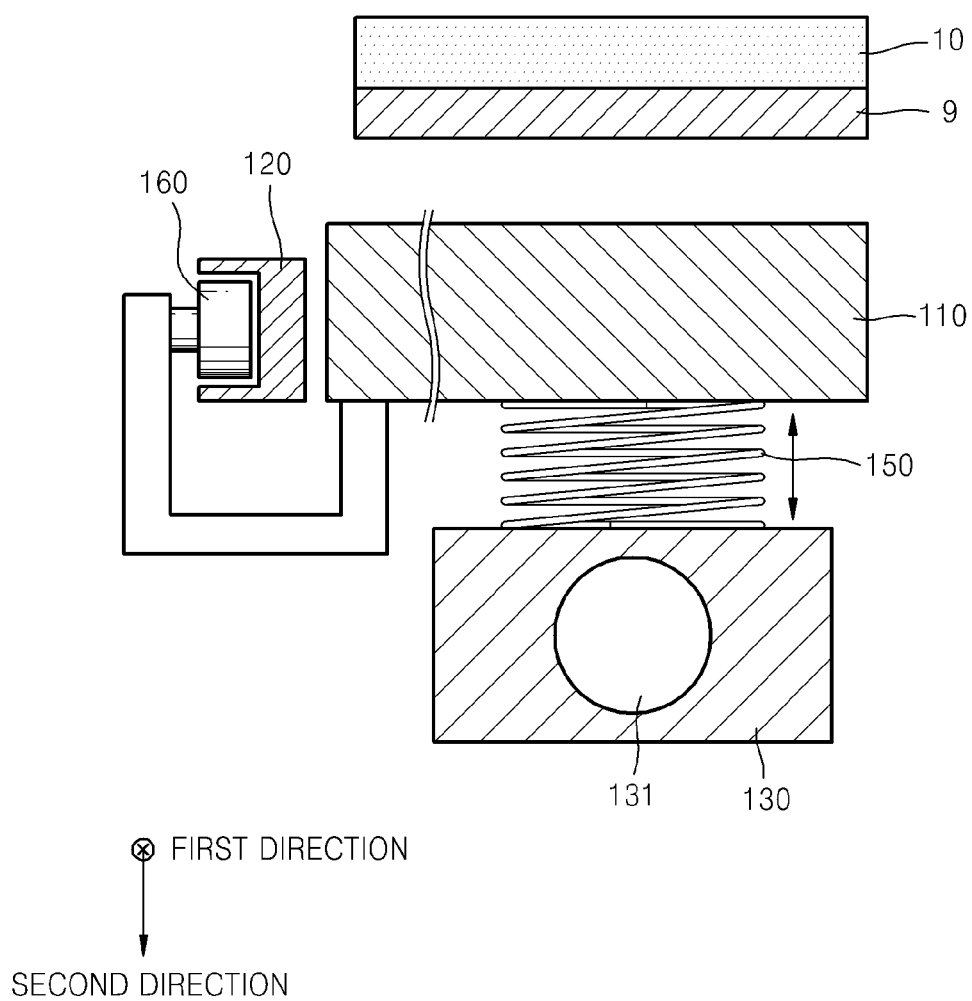
FIG. 3 is a cross-sectional view along line I-I' of FIG. 2.

FIGS. 2 and 3 show the magnet transportation system 100 included in the sputtering apparatus 200 of FIG. 1, in more detail. FIG. 3 is a cross-sectional view of the magnet transportation system 100 taken along line of FIG. 2. The magnet transportation system 100 includes the magnet member 110 for applying a magnetic field to the sputtering target 10 while reciprocating in a first direction and an opposite direction thereof, a guide rail 120 connected to the magnet member 110 and guiding the magnet member 110, a screw line 140 for converting a rotation movement to a linear movement, a connection block 130 surrounding the screw line 140 and moving the magnet member 110, and an elastic member 150 for connecting the connection block 130 and the magnet member 110 to each other.

The magnet member 110 can be used to apply a magnetic field to the sputtering target 10, and it faces a second surface of the sputtering target 10. Thus, metal particles are generated from the sputtering target 10 by the magnetic field generated by the magnet member 110. The generated metal particles cause plasma discharge between the sputtering target 10 and the substrate 3. Metal particles may be sputtered on the substrate 3 facing the first surface of the sputtering target 10 along a movable magnetic field formed by the magnet member 110. The magnet member 110 is spaced apart from the sputtering target 10. An appropriate distance by which the magnet member 110 is spaced apart from the sputtering target 10 may be determined according to a type, quality of the sputtering target 10, a required thickness and uniformity of thin film, and a required intensity of a magnetic field.

The magnet member 110 is connected to the guide rail 120 by a connector 160. The guide rail 120 is connected to the magnet member 110 so as to support and guide the magnet member 110. In addition, the magnet member 110 may be smoothly moved along a shape of the guide rail 120 through the connector 160. A portion of the connector 160, which contacts the guide rail 120, may be embodied by bearings having various shapes, such as a ball bearing, a wheel-shaped bearing, or the like. In various embodiments, the connector 160 may be formed of Au, plastic, or the like.

The guide rail 120 supports and guides the magnet member 110, and includes a linear portion B, and an inclined portion A. The linear portion B corresponds to a central portion of the sputtering target 10, and is formed in the first direction parallel to the second surface of the sputtering target 10. The inclined portion A is a portion corresponding to an edge portion of the sputtering target 10, and is formed in a second direction, perpendicular to the first direction, oriented away from the sputtering target 10. In some embodiments, the first direction is a direction parallel to a proceeding direction of the magnet member 110, and is a direction parallel to the second surface of the sputtering target 10. The second direction is perpendicular to the first direction, and is also perpendicular to the second surface of the sputtering target 10. In some embodiments, the portion corresponding to the edge portion of the sputtering target 10 includes the starting portion, the turning portion or the ending portion of the magnet member 110. In some embodiments, the thickness of a thin film formed on the substrate 3 may be controlled by changing the intensity of the magnetic field during the sputtering. The edge portion of the sputtering target 10, which can be the starting portion, the turning portion or the ending portion of the magnet member 110, may be more eroded than the remaining portions. This may be due to the fact that a period of time when the magnet member 110 stays operative during a starting or ending operation may be increased and a period of time when the magnet member 110 stays operative during a turning operation may be increased. In some embodiments, the central portion and the edge portion of the sputtering target 10 may be uniformly eroded by changing the intensity of the magnetic field on the edge portion of the sputtering target 10. In presence of the inclined portion A of the guide rail 120, the magnet member 110 is further away from the sputtering target 10 on the edge portion of the sputtering target 10. Thus, the intensity of the magnetic field generated from the magnet member 110 is weakened, and thus the edge portion and the central portion of the sputtering target 10 may be uniformly eroded.

The inclined portion A of the guide rail 120 may be inclined at an inclination angle of about 10 to about 60 degrees with respect to the linear portion B. The inclination angle of the inclined portion A may be changed according to a material or quality of the magnet member 110, or may be changed according to the characteristics of a required thin film.

A groove may be formed in the guide rail 120 so that the connection unit 160 extending from the magnet member 110 and connected to the guide rail 120 may be inserted into the guide rail 120. In other embodiments, an opening line may be formed so that the connection unit 160 may be inserted into the guide rail 120.

The screw line 140 may be formed in the first direction so as to correspond to the guide rail 120. The screw line 140 may be connected to a motor 170. The motor 170 may be a general motor, or alternatively, may be a geared motor. The screw line 140 may be connected to the motor 170 through a belt of the screw line 140.

The screw line 140 has a circular sectional shape. A screw is formed on an outer surface of the screw line 140, and contacts the connection block 130. The screw line 140 moves the connection block 130 connected to the screw line 140 linearly in the first direction or in the opposite direction thereof while rotating with respect to the motor 170. The screw line 140 converts a rotation movement to a linear movement, and thus the connection block 130 and the magnet member 110 connected thereto are moved to the first direction. The screw line 140 is spaced apart from the guide rail 120, and is spaced apart from the sputtering target 10 so as to be parallel to the sputtering target 10. A length of the screw line 140 may be greater than a length of one side of the substrate 3 since metal particles may be sputtered up to an outermost edge portion of the substrate 3. When the screw line 140 rotates clockwise, the screw line 140 may move the connection block 130 in the first direction. When the screw line 140 rotates counterclockwise, the screw line 140 may move the connection block 130 in the opposite direction thereof. In other embodiments, the screw line 140 may move the connection block 130 in the reverse directions. In some embodiments, a single screw line 140 may be used, and the screw line 140 may be a ball. In other embodiments, at least two screw lines may be used, and the shape of the screw line 140 may be different.

Referring to FIG. 3, a first side of the connection block 130 is connected to the magnet member 110. A through hole 131 is formed in a second side of the connection block 130 so that the screw line 140 may be inserted into the through hole 131. Thus, the connection block 130 moves together with the magnet member 110 while moving in the first direction or the opposite direction thereof according to the rotation movement of the screw line 140. The connection block 130 is formed of metal or plastic, and the thickness and shape of the connection block 130 are not particularly limited. In one embodiment, the size of the connection block 130 may be formed so as to include the through hole 131 to which the screw line 140 is inserted.

The connection block 130 may include a plurality of through holes according to the number of screw lines. The shape and size of the through hole 131 may correspond to the shape and size of the cross-section of the screw line 140.

The connection block 130 is connected to the magnet member 110 by the elastic member 150. The elastic member 150 is connected between the first side of the connection block 130 and a first side of the magnet member 110, facing the connection block 130. In some embodiments, the elastic member 150 may be a compression coil spring. The elastic member 150 moves the magnet member 110 in the first direction by the connection block 130, and simultaneously may guide the magnet member 110 along the guide rail 120. The elastic member 150 may move the magnet member 110 along a movement direction of the connection block 130 according to the shape of the guide rail 120.

For illustrative purposes, when the magnet member 110 is positioned in the linear portion B of the guide rail 120, the compression coil spring is relaxed. Then, as the connection block 130 moves in the first direction, the magnet member 110 is moved along the linear portion B of the guide rail 120. When the magnet member 110 is positioned in the inclined portion A of the guide rail 120, the compression coil spring is compressed. Then, as the connection block 130 moves in the first direction, the magnet member 110 is moved along the inclined portion A of the guide rail 120. In the presence of the elastic member 150, the magnet member 110 may be smoothly moved from the inclined portion A to the linear portion B of the guide rail 120, or from the linear portion B to the inclined portion A. Since a distance between the magnet member 110 and the connection block 130 may be controlled by relaxation and compression of the elastic member 150, when the magnet member 110 is moved in the first direction by the connection block 130, the magnet member 110 may be moved along a path of the guide rail 120. In some embodiments, the elastic member 150 can be a compression coil spring. In other embodiments, a cylindrical spring, an enveloping spring, or the like may be used.

Figure 4A:
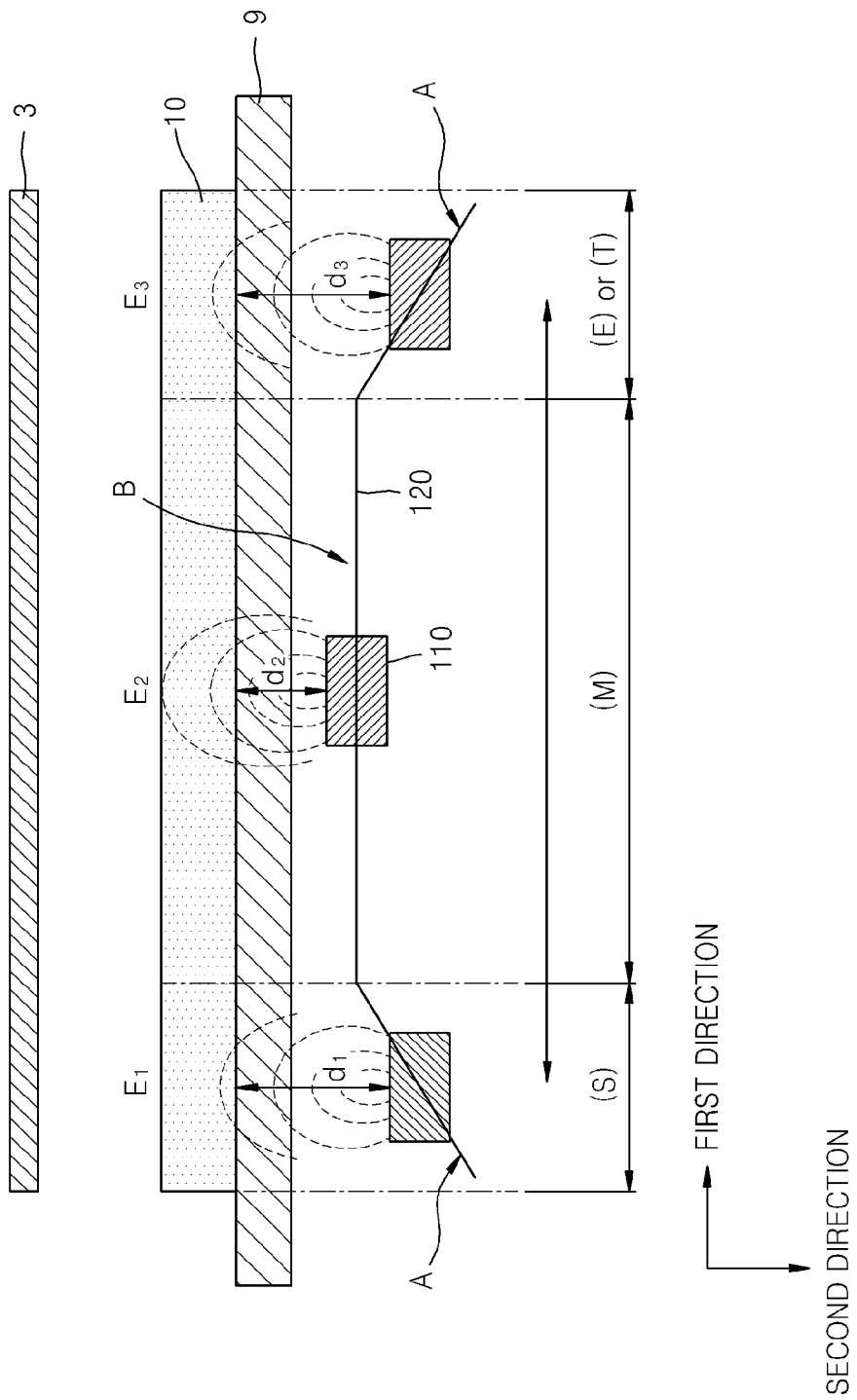
FIGS. 4A and 4B illustrate an embodiment of a sputtering method using a sputtering apparatus.
Figure 4B:
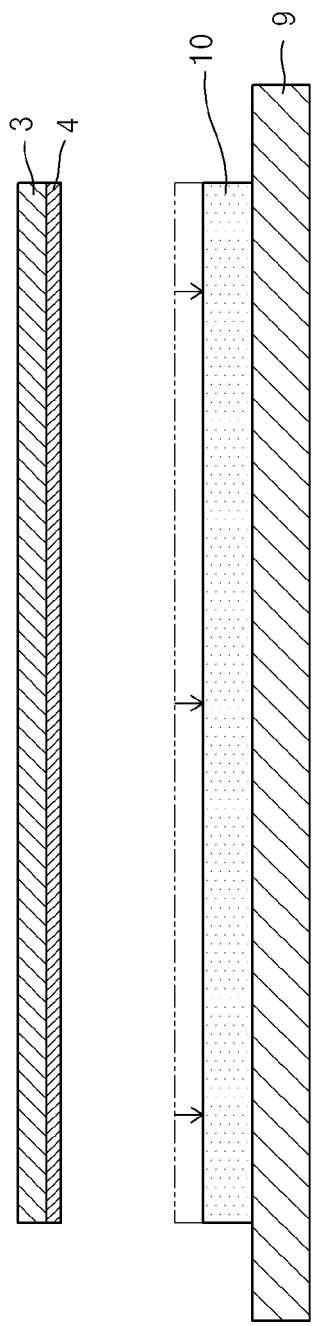

FIGS. 4A and 4B show an embodiment of a sputtering method using the sputtering apparatus 200.

For convenience of description, FIGS. 4A and 4B show a path of the guide rail 120, and the magnet member 110 that is positioned along the path. The connection block 130, the screw line 140, the elastic member 150, and the motor 170 are not shown in FIGS. 4A and 4B.

Referring to FIGS. 4A and 4B, the substrate 3 is prepared, and the sputtering target 10 is disposed on a lower surface of the substrate 3. In addition, the magnet member 110 is disposed on a lower surface of the sputtering target 10, and the magnet member 110 is moved in the first direction to apply a magnetic field to the sputtering target 10. Then, plasma discharge is caused to a portion corresponding to the magnet member 110, and a target material is generated from the sputtering target 10. The target material is deposited on the substrate 3 to form a thin film on the substrate.

Referring to FIG. 4A, since the guide rail 120 includes the inclined portion A in a starting portion S, the magnet member 110 is positioned away from the sputtering target 10 by a distance d1. Thus, a magnetic field E1 is applied to the sputtering target 10. While the screw line 140 rotates, the screw line 140 moves the connection block 130 in the first direction, and since the magnet member 110 is connected to the guide rail 120, the magnet member 110 is moved in the first direction along the guide rail 120.

Since the guide rail 120 includes the linear portion B in a central portion M, the magnet member 110 is positioned away from the sputtering target 10 by a distance d2. Thus, a magnetic field E2 is applied to the sputtering target 10. Then, while the screw line 140 rotates, the screw line 140 moves the connection block 130 in the first direction, and since the magnet member 110 is connected to the guide rail 120, the magnet member 110 is moved in the first direction along the guide rail 120.

Since the guide rail 120 includes the inclined portion A in an ending portion E, the magnet member 110 is positioned away from the sputtering target 10 by a distance d3. When the magnet member 110 is moved in the opposite direction of the first direction, the ending portion E may be a turning portion T. Likewise, the magnet member 110 may reciprocate in the first direction or the opposite direction thereof. By the applied magnetic field, the target material may be generated from the sputtering target 10 so as to form a metal thin film on the substrate 3.

In some embodiments, the distance d1 and the distance d3 are greater than the distance d2. Thus, an intensities of the magnetic field E1 and of the magnetic field E3 are smaller than that of the magnetic field E2. An intensity of a magnetic field on the portion corresponding to the edge portion of the sputtering target 10 is smaller than that of a portion corresponding to the central portion of the sputtering target 10. The magnet member 110 is further away from the edge portions of the sputtering target 10.

Thus, as illustrated in FIG. 4B, the edge portions and the central portion of the sputtering target 10 are uniformly eroded, thereby increasing the usage efficiency of the sputtering target 10. In experimental results, usage efficiency of a typical sputtering target was measured to be about 20 to about 30%. In various embodiments, the usage efficiency of the sputtering target 10 may be increased to at least 40%.

According to embodiments of the present invention, by using a magnet transportation system, a sputtering apparatus including the same, and a sputtering method using the sputtering apparatus, as a magnet member is further away from a sputtering target through a guide rail including an inclined portion and an elastic member in an edge potion of the sputtering target, a magnetic field is weakened, and thus a deposition rate is reduced, and the sputtering target is less eroded. Thus, an erosion degree difference between a central portion and an edge portion of the sputtering target may be reduced, and thus the sputtering target may be uniformly eroded, thereby increasing the usage efficiency of an entire portion of the sputtering target.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. A sputtering apparatus comprising:
a substrate;
a sputtering target having a first surface facing the substrate;
a magnet configured to apply a magnetic field to the sputtering target, and facing a second surface of the sputtering target;
a guide rail connected to the magnet configured to support and guide the magnet member, wherein a first portion of the guide rail, corresponding to a central portion of the sputtering target, comprises a linear portion in a first direction parallel to the second surface of the sputtering target, and wherein a second portion of the guide rail, corresponding to an edge portion of the sputtering target, comprises an inclined portion away from the sputtering target in a second direction perpendicular to the first direction;
a screw line formed in the first direction in parallel to the guide rail; and
a connector connected to the magnet by an elastic, configured to move the magnet in the first direction along the screw line.

2. The sputtering apparatus of claim 1, further comprising a plate configured to support the second surface of the sputtering target.

3. The sputtering apparatus of claim 1, wherein the magnet is spaced apart from the sputtering target.

4. The sputtering apparatus of claim 1, further comprising a motor configured to rotate the screw line,
wherein the connector moves in the first direction while the screw line is rotated by the motor.

5. The sputtering apparatus of claim 1, wherein the elastic comprises a compression coil spring, and
wherein, when the magnet is positioned in the linear portion, the compression coil spring is relaxed, and wherein, when magnet is positioned in the inclined portion, the compression coil spring is compressed.

6. The sputtering apparatus of claim 1, wherein the magnet is connected to the guide rail through a bearing.

7. The sputtering apparatus of claim 1, wherein the portion of the guide rail along an edge portion of the sputtering target, corresponds to at least one of a starting portion, a turning portion and an ending portion of the magnet.

8. A magnet transportation system comprising:
a magnet configured to apply a magnetic field to a sputtering target facing a surface of the sputtering target;
a guide rail connected to the magnet configured to support and guide the magnet, wherein a portion of the guide rail along a central portion of the sputtering target comprises a linear portion formed in a first direction parallel to the surface of the sputtering target, and wherein a portion of the guide rail, along an edge portion of the sputtering target, comprises a portion inclined away from the sputtering target in a second direction perpendicular to the first direction;
a screw line formed in the first direction parallel to the guide rail; and
a connector connected to the magnet by an elastic configured to move the magnet member in the first direction along the screw line.

9. The magnet transportation system of claim 8, further comprising a motor configured to rotate the screw line,
wherein the connector moves in the first direction while the screw line is rotated by the motor.

10. The magnet transportation system of claim 8, wherein the elastic comprises a compression coil spring, and
wherein, when the magnet is positioned in the linear portion, the compression coil spring is relaxed, and
wherein, when magnet is positioned in the inclined portion, the compression coil spring is compressed.

11. The magnet transportation system of claim 8, wherein the magnet is connected to the guide rail through a bearing.

12. The magnet transportation system of claim 8, wherein the portion of the guide rail along an edge portion of the sputtering target, comprises at least one of a starting portion, a turning portion and an ending portion of the magnet.

13. A sputtering method of a sputtering apparatus, wherein the sputtering apparatus comprises: a sputtering target having a first surface facing a substrate; a magnet configured to apply a magnetic field to the sputtering target, and facing a second surface of the sputtering target; a guide rail connected to the magnet configured to support and guide the magnet, wherein a portion of the guide rail, along a central portion of the sputtering target, comprises a linear portion formed in a first direction parallel to the second surface of the sputtering target, and wherein a portion of the guide rail, along an edge portion of the sputtering target, comprises a portion inclined away from the sputtering target in a second direction perpendicular to the first direction; a screw line formed in the first direction so as to correspond to the guide rail; and a connector connected to the magnet by an elastic, configured to move the magnet in the first direction along the screw line, the method comprising:
preparing the substrate;
applying a magnetic field to the sputtering target while the magnet is moved in the first direction parallel to the second surface of the sputtering target; and
generating a target material from the sputtering target corresponding to the magnet by the magnetic field, and depositing the target material on the substrate,
wherein, in the applying of the magnetic field, an intensity of the magnetic field is changed in the portion of the guide rail, corresponding to the edge portion of the sputtering target.

14. The method of claim 13, wherein the intensity of the magnetic field is changed by the inclined portion of the guide rail.

15. The method of claim 13, further comprising moving the connector in the first direction while the screw line is rotated by a motor.

16. The method of claim 13, wherein when the magnet is positioned in the linear portion, the elastic is relaxed, and when the magnet is positioned in the inclined portion, the elastic is compressed.

17. The method of claim 16, wherein the elastic comprises a compression coil spring.

* * * * *

UNITED STATES PATENT AND TRADEMARK OFFICE
CERTIFICATE OF CORRECTION

| | | |
|---|---|---|
| PATENT NO. | : 8,512,527 B2 | Page 1 of 1 |
| APPLICATION NO. | : 13/177852 | |
| DATED | : August 20, 2013 | |
| INVENTOR(S) | : Youn-Goo Lee | |

It is certified that error appears in the above-identified patent and that said Letters Patent is hereby corrected as shown below:

In the Specification

At column 3, line 2, please delete "magnetic filed," and insert -- magnetic field --, therefor.

Signed and Sealed this
Sixth Day of May, 2014

Michelle K. Lee
*Deputy Director of the United States Patent and Trademark Office*